(12) United States Patent
Hebiguchi et al.

(10) Patent No.: US 11,016,125 B2
(45) Date of Patent: May 25, 2021

(54) CURRENT SENSOR

(71) Applicant: Alps Alpine Co., Ltd., Tokyo (JP)

(72) Inventors: Hiroyuki Hebiguchi, Miyagi-ken (JP);
Manabu Tamura, Miyagi-ken (JP);
Eiichiro Matsuyama, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 38 days.

(21) Appl. No.: 16/533,421

(22) Filed: Aug. 6, 2019

(65) Prior Publication Data

US 2019/0361055 A1    Nov. 28, 2019

Related U.S. Application Data

(63) Continuation of application No. PCT/JP2018/003784, filed on Feb. 5, 2018.

(30) Foreign Application Priority Data

Mar. 6, 2017    (JP) .............................. JP2017-041786

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC .......................... G01R 15/207; G01R 19/0092
See application file for complete search history.

(56) References Cited

U.S. PATENT DOCUMENTS

| 5,831,425 | A | * | 11/1998 | Ochiai | ................... | G01R 1/203 |
| | | | | | | 324/117 R |
| 7,538,540 | B2 | * | 5/2009 | Tsukamoto | ............ | G01R 15/20 |
| | | | | | | 324/117 R |
| 8,421,450 | B2 | | 4/2013 | Ito | | |
| 8,427,133 | B2 | | 4/2013 | Ito et al. | | |
| 2012/0112365 | A1 | | 5/2012 | Ausserlechner et al. | | |
| 2017/0003323 | A1 | * | 1/2017 | Nakayama | ............ | H02M 7/003 |
| 2018/0031613 | A1 | * | 2/2018 | Nakayama | ............ | G01R 33/05 |

FOREIGN PATENT DOCUMENTS

| JP | 2001 074783 | 3/2001 |
| JP | 2015 141100 | 8/2015 |
| JP | 2015 152418 | 8/2015 |
| JP | 2015 175757 | 10/2015 |

OTHER PUBLICATIONS

International Search Report from corresponding international application No. PCT/JP2018/003784, 3pgs., dated May 1, 2018.

* cited by examiner

*Primary Examiner* — Akm Zakaria
(74) *Attorney, Agent, or Firm* — Brinks Gilson & Lione

(57) ABSTRACT

A current sensor includes a substrate, a first bus bar, and a second bus bar. The first bus bar includes a first terminal portion, a first rising portion, a first extending portion, a first cutout portion, and a first stepped portion. The second bus bar includes a second terminal portion, a second rising portion, a second extending portion, a second cutout portion, and a second stepped portion. The second stepped portion and the second rising portion are connected together. A second magneto-electric conversion element is mounted on the lower surface of the substrate. A first magneto-electric conversion elements is mounted on the upper surface of the substrate.

3 Claims, 6 Drawing Sheets

FIG. 2A
FIG. 2B
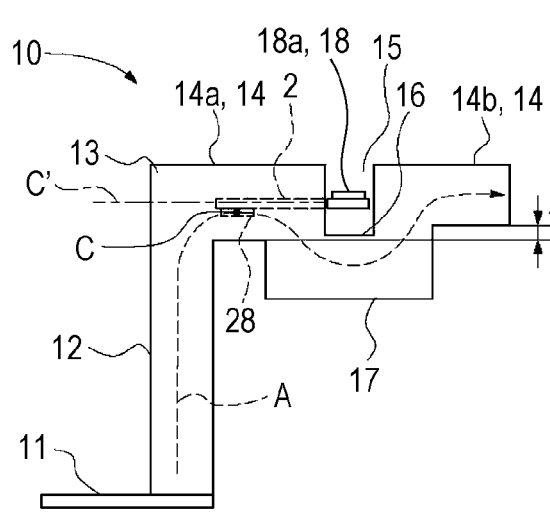
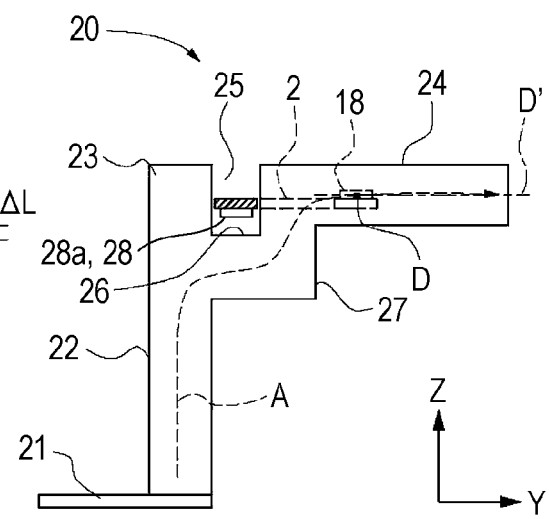

CURRENT SENSOR

CLAIM OF PRIORITY

This application is a Continuation of International Application No. PCT/JP2018/003784 filed on Feb. 5, 2018, which claims benefit of priority to Japanese Patent Application No. 2017-041786 filed on Mar. 6, 2017. The entire contents of each application noted above are hereby incorporated by reference.

BACKGROUND

1. Field of the Disclosure

The present disclosure relates to current sensors that calculate a current value based on a magnetic field generated by a current to be measured and, in particular, to a current sensor that reduces the influence of bus bars located next to it.

2. Description of the Related Art

A known example of the current sensors that calculate a current value based on a magnetic field generated by a current to be measured is disclosed in Japanese Unexamined Patent Application Publication No. 2015-152418. The current sensor described in Japanese Unexamined Patent Application Publication No. 2015-152418 is disposed in the vicinity of bus bars that transmit three-phase alternate current power to a three-phase alternating current motor to measure the current flowing through these bus bars with magneto-electric conversion elements.

The current sensor with this type of bus bars has a plurality of metal plates which are disposed vertically parallel to each other, with their plate thickness surfaces disposed on the top and the bottom. The metal plates each have a rectangular cutout from one of (above) the plate thickness end faces. The magneto-electric conversion elements are disposed in the cutout portion to measure the current flowing through the bus bars.

Each magneto-electric conversion element is disposed so that its magnetosensitive surface faces the plate thickness surface of the bus bar. The height of disposition is aligned with the height of the center of the magnetic field of the bus bar next to it. This is for the purpose of making the center of the magnetic field from the adjacent bus bar orthogonal to the magnetosensitive surface of the magneto-electric conversion element so that the magneto-electric conversion element is not affected by the noise from the adjacent bus bar.

Japanese Unexamined Patent Application Publication No. 2015-152418 discloses a configuration of the installation of the magneto-electric conversion elements. FIG. 1 of this reference illustrates a crank-shaped substrate that is formed to fit the shape of the cutouts shifted in position in the extending direction of the bus bars. The substrate is disposed in the horizontal direction, and the magneto-electric conversion elements are disposed on the surface of the substrate.

The current sensor disclosed in Japanese Unexamined Patent Application Publication No. 2015-152418 is configured such that each magneto-electric conversion element is disposed at the center of the current through the adjacent bus bar in view of the fact that the center of the current through the adjacent bus bar is shifted from the center of the bus bar in the height direction due to the rectangular cutout formed in the bus bar.

This type of bus bars are often used in vehicles, such as hybrid cars. The bus bars used in vehicles need to be bent at a right angle at multiple portions, and the straight portions cannot be long because of the issues of the relationship with other devices, requests for size reduction, and so on.

In such a situation, the disposition of the magneto-electric conversion elements as described in Japanese Unexamined Patent Application Publication No. 2015-152418 needs to dispose the cutout for disposing the magneto-electric conversion element in the vicinity of the square corner. Verification of the inventors of this application shows that disposing the cutout portion in the vicinity of the corner of the bus bar increases the influence of the magnetic field from the adjacent bus bar on the magneto-electric conversion element to inevitably increase the noise to the magneto-electric conversion elements, decreasing the signal-to-noise (S/N) ratio.

SUMMARY

A current sensor includes a plurality of bus bars disposed parallel to each other, a magneto-electric conversion element that detects an induction magnetic field generated due to a current flowing through the bus bars, and an insulating substrate on which the magneto-electric conversion element is mounted. The bus bars each include a rising portion rising upward from a reference surface that is a horizontal surface, an extending portion extending from the rising portion in a direction parallel to the reference surface, a cutout portion recessed downward from an upper end of the extending portion, and a stepped portion disposed so as to include a lower part of the cutout portion and protruding downward from a lower end of the extending portion. The plurality of bus bars include at least a first bus bar and a second bus bar located next to the first bus bar. The first bus bar includes a first rising portion that is the rising portion, a first extending portion that is the extending portion, a first cutout portion that is the cutout portion, and a first stepped portion that is the stepped portion. The second bus bar includes a second rising portion that is the rising portion, a second extending portion that is the extending portion, a second cutout portion that is the cutout portion, and a second stepped portion that is the stepped portion.

The magneto-electric conversion element includes a first magneto-electric conversion element disposed at the first bus bar and a second magneto-electric conversion element disposed at the second bus bar. Each of the first magneto-electric conversion element and the second magneto-electric conversion element are disposed in the cutout portion in such a manner that a mount surface faces a bottom surface of the cutout portion and that a sensitive axis is orthogonal to a side of an adjacent bus bar. The first stepped portion is disposed away from the first rising portion in an extending direction of the first extending portion, and the second magneto-electric conversion element is disposed so as to face a side of the first extending portion located between the first rising portion and the first cutout portion. The second stepped portion is disposed contiguously from the second rising portion in an extending direction of the second extending portion, and the first magneto-electric conversion element is disposed so as to face a side of the second extending portion located contiguously to the second cutout portion in the extending direction. The second magneto-electric conversion element is disposed lower than the first magneto-electric conversion element.

The current sensor according to the embodiment of the present invention is configured such that the magneto-electric conversion element at the second bus bar is disposed near the rising portion as compared with the first bus bar. The second magneto-electric conversion element located in the second cutout portion faces a side of the first extending portion between the first rising portion and the first stepped portion of the first bus bar. With a recent demand for size reduction of the bus bars, a need to decrease the length of the first extending portion of the first bus bar in the extending direction arises. Various experiments performed by the inventors show that in the case where the first extending portion is short, the center of current passing through the first extending portion shifts to the lower part of the first extending portion.

The current sensor according to the embodiment of the present invention is configured such that the second magneto-electric conversion element is disposed lower than the first magneto-electric conversion element. This can prevent being affected by the magnetic field generated at the first extending portion of the first bus bar adjacent to the side of the second magneto-electric conversion element.

The current sensor according to the embodiment of the present invention is configured such that the magneto-electric conversion elements face, in the cutout portion, the bottom surface of the current portion and that its sensitive axis is orthogonal to the side of the adjacent bus bar. The sensitive axis is an axis indicating an orientation of the magneto-electric conversion element suitable for detecting an induction magnetic field. The sensitive axis is made orthogonal to the side of the adjacent bus bar so as not to be affected by the induction magnetic field from the bus bar.

BRIEF DESCRIPTION OF THE DRAWINGS

FIG. 2A is an explanatory diagram illustrating the state of a first bus bar of the present embodiment viewed from the side;

FIG. 2B is an explanatory diagram illustrating the state of a second bus bar of the present embodiment viewed from the side;

DESCRIPTION OF THE EXEMPLARY EMBODIMENTS

Figure 1:
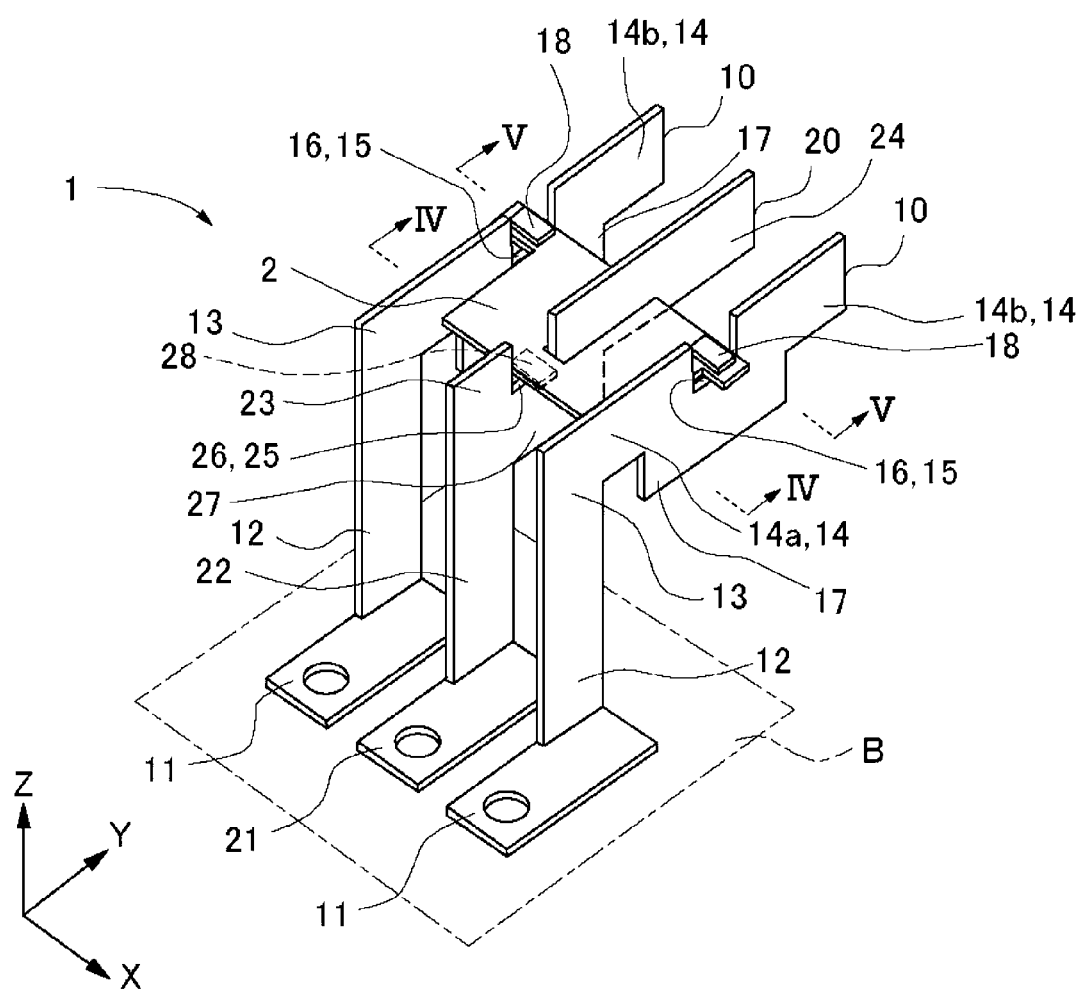
FIG. 1 is a schematic perspective view of a current sensor which is an exemplary embodiment of the present invention.

Next, embodiments of the present invention will be described with reference to FIGS. 1 to 6. As illustrated in FIG. 1, a current sensor 1 of an embodiment includes three bus bars disposed parallel to each other, each bus bar has a cutout portion, and a substrate on which magneto-electric conversion elements are mounted is disposed in the cutout portions. An example of the magneto-electric conversion elements is a magnetoresistive sensor.

In FIG. 1, the bus bars are such that first bus bars 10 are disposed on the near side and the back, between which a second bus bar 20 is disposed. As illustrated in FIG. 1 and FIGS. 2A and 2B, the first bus bars 10 and the second bus bar 20 are formed by press-working a metal plate and are disposed, with the plate thickness direction orientated in the vertical direction (the Z-direction in FIG. 1) and in the extending direction (the Y-direction in FIG. 1). The sides of the bus bars are orientated in the X-direction in FIG. 1.

These bus bars each have a terminal portion (a first terminal portion 11 or a second terminal portion 21) to be connected to another device or the like. In the present embodiment, the back side of the terminal portion is a reference surface (a horizontal surface) B.

The first bus bars 10 each include a first rising portion 12 rising upward from the first terminal portion 11 of the reference surface B, a first corner 13 located at the upper end of the first rising portion 12, and a first extending portion 14 extending from the first corner 13 in the extending direction.

The first extending portion 14 includes a first cutout portion 15 that is cut out from above to below in a square U-shape (a rectangular shape). A first magneto-electric conversion elements 18 (described later) is disposed in the first cutout portion 15. A first stepped portion 17 protruding downward from the lower end of the first extending portion 14 is provided so as to include a part lower than the first cutout portion 15 (specifically, a part lower than a first bottom surface 16 which is the bottom surface of the first cutout portion 15).

In the present embodiment, the first extending portion 14 of the first bus bar 10 is divided into a proximal first extending portion 14a located at a position close to the first rising portion 12 and a distal first extending portion 14b located farther in the extending direction than the first cutout portion 15.

In the present embodiment, the vertical width of the proximal first extending portion 14a is wider than the vertical width of the distal first extending portion 14b. In other words, as illustrated in FIG. 2A, the lower end edge of the proximal first extending portion 14a is disposed lower than the lower end edge of the distal first extending portion 14b by a length $\Delta L$.

The second bus bar 20 includes a second rising portion 22 rising from the second terminal portion 21 of the reference surface B, a second corner 23 located at the upper end of the second rising portion 22, and a second extending portion 24 extending in the extending direction. The second extending portion 24 includes a second cutout portion 25 that is cut out from above to below in a square U-shape, and a second stepped portion 27 protruding downward from a second bottom surface 26 which is the bottom surface of the second cutout portion 25. A second magneto-electric conversion element 28 (described later) is disposed in the second cutout portion 25. In the present embodiment, the second stepped portion 27 is disposed continuously with the second rising portion 22. The second extending portion 24 is not provided between the second rising portion 22 and the second stepped portion 27.

As illustrated in FIG. 1 and FIGS. 2A and 2B, the substrate 2 is disposed in the horizontal direction across the two first bus bars 10 and the one second bus bar 20. Two first magneto-electric conversion elements 18 are mounted on the upper surface of the substrate 2, and one second magneto-electric conversion element 28 is mounted on the lower surface. The other of the configuration of the substrate 2 is not illustrated.

Figure 3:
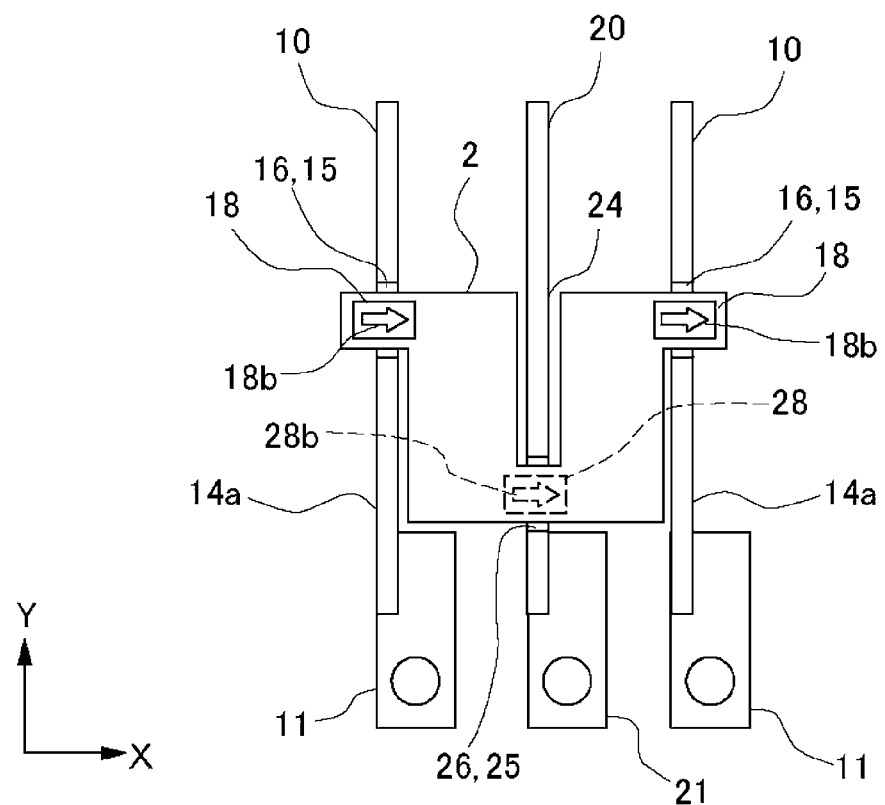
FIG. 3 is a plan view of the current sensor in FIG. 1.

As illustrated in FIG. 1 and FIGS. 2A and 2B, the first magneto-electric conversion element 18 is disposed above the first bottom surface 16, in the first cutout portion 15 of the first bus bar 10. Since the first magneto-electric conversion element 18 is mounted on the upper surface of the substrate 2, a first mount surface 18a is fixed so as to face the first bottom surface 16, with the substrate 2 therebetween. As illustrated in FIG. 3, the first magneto-electric conversion elements 18 are disposed so that first sensitive axes 18b, which are sensitive axes (the arrows in the first magneto-electric conversion elements 18 in FIG. 3), are orthogonal to the sides of the second extending portion 24 of the adjacent second bus bar 20.

As illustrated in FIG. 1 and FIGS. 2A and 2B, the second magneto-electric conversion element 28 is disposed above the second bottom surface 26, in the second cutout portion 25 of the second bus bar 20. Since the second magneto-electric conversion element 28 is mounted on the lower surface of the substrate 2, a second mount surface 28a is fixed so as to directly face the second bottom surface 26. As illustrated in FIG. 3, the second magneto-electric conversion element 28 is disposed so that a second sensitive axis 28b, which is a sensitive axis (the arrow in the second magneto-electric conversion element 28 in FIG. 3), is orthogonal to the sides of the proximal first extending portions 14a of the first bus bars 10 next to the both sides.

Thus, in the present embodiment, the first sensitive axes 18b and the second sensitive axis 28b are disposed in the X-direction in a plane parallel to the front surface or the back surface of the substrate 2 (in the X-Y direction). Thus, the first sensitive axis 18b is disposed in a direction perpendicular to the extending direction (Y-direction) of the first extending portion 14 in the first cutout portion 15 of the first bus bar 10. The second sensitive axis 28b is similarly disposed in a direction perpendicular to the extending direction of the second extending portion 24.

Next, an operation of the current sensor 1 of the present embodiment when detecting the current through the first bus bars 10 and the second bus bar 20 will be described. In FIGS. 2A and 2B, the dotted lines denoted by reference sign A indicate the center of the flow of the current in the first bus bars 10 and the second bus bar 20.

When current flows through the first bus bar 10, the current moves upward along the first rising portion 12, then passes through the first corner 13 and the proximal first extending portion 14a, turns to the first stepped portion 17 at the first cutout portion 15, and flows from the first stepped portion 17 to the distal first extending portion 14b, as illustrated in FIG. 2A.

As illustrated in FIG. 2A, at the proximal first extending portion 14a, the current from the first rising portion 12 is curved at the first corner 13 and flows toward the proximal first extending portion 14a. The current flows through a position (a point C in FIG. 2A) lower than the central position of the proximal first extending portion 14a (a dashed-dotted line C' in FIG. 2A) because the first cutout portion 15 is present at the rear end of the proximal first extending portion 14a.

Figure 4:
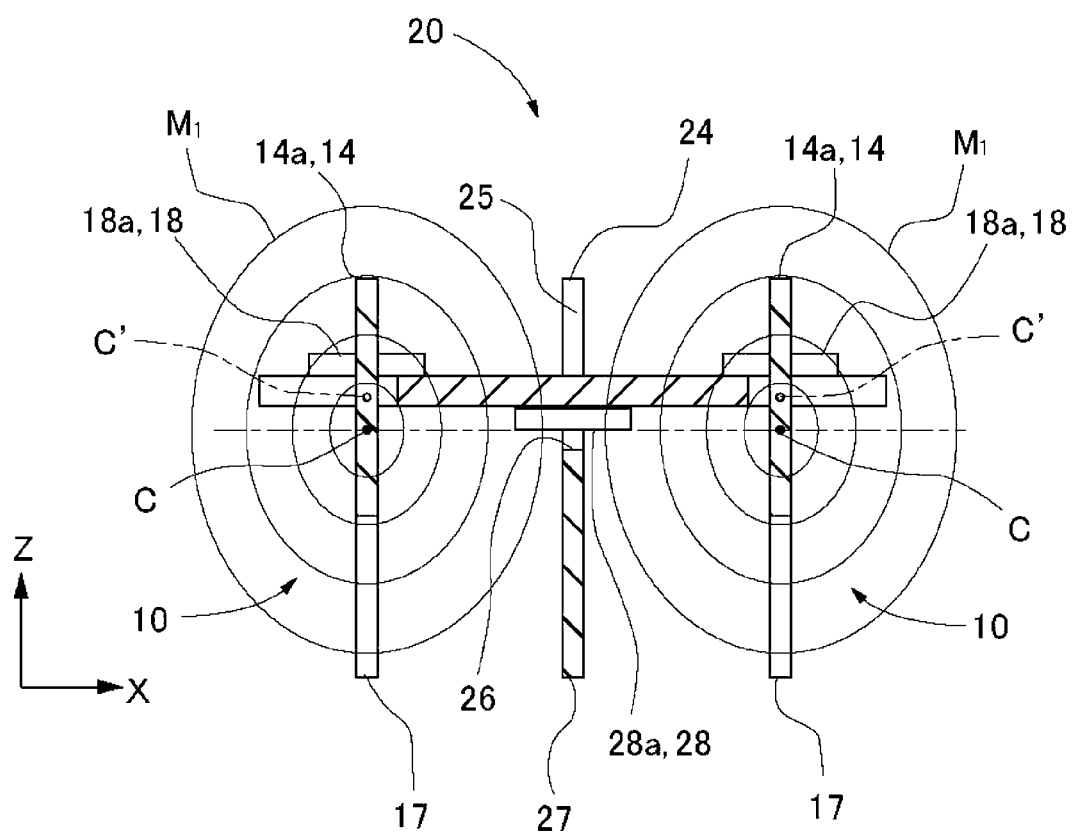
FIG. 4 is a cross-sectional view taken along line IV-IV in of FIG. 1.

In the present embodiment, as illustrated in FIG. 4, the vertical position of the second magneto-electric conversion element 28 is aligned to the position C of the center of the current at the proximal first extending portion 14a. This reduces the influence of the magnetic field $M_1$ from the first bus bars 10 on the second magneto-electric conversion element 28. Since, in the present embodiment, the vertical width of the proximal first extending portion 14a is wider than the vertical width of the distal first extending portion 14b, the electrical resistance of the first bus bars 10 can be reduced.

In the second bus bar 20, as illustrate in FIG. 2B, the second rising portion 22 and the second stepped portion 27 are continuously formed, the current flows upward along the second rising portion 22 and passes through the second stepped portion 27 to the second extending portion 24. At that time, the center of the current rises in an oblique direction along the second stepped portion 27 and passes through substantially the central position of the second extending portion 24 in the vertical direction (a point D and a dashed-dotted line D' in FIG. 2B).

Figure 5:
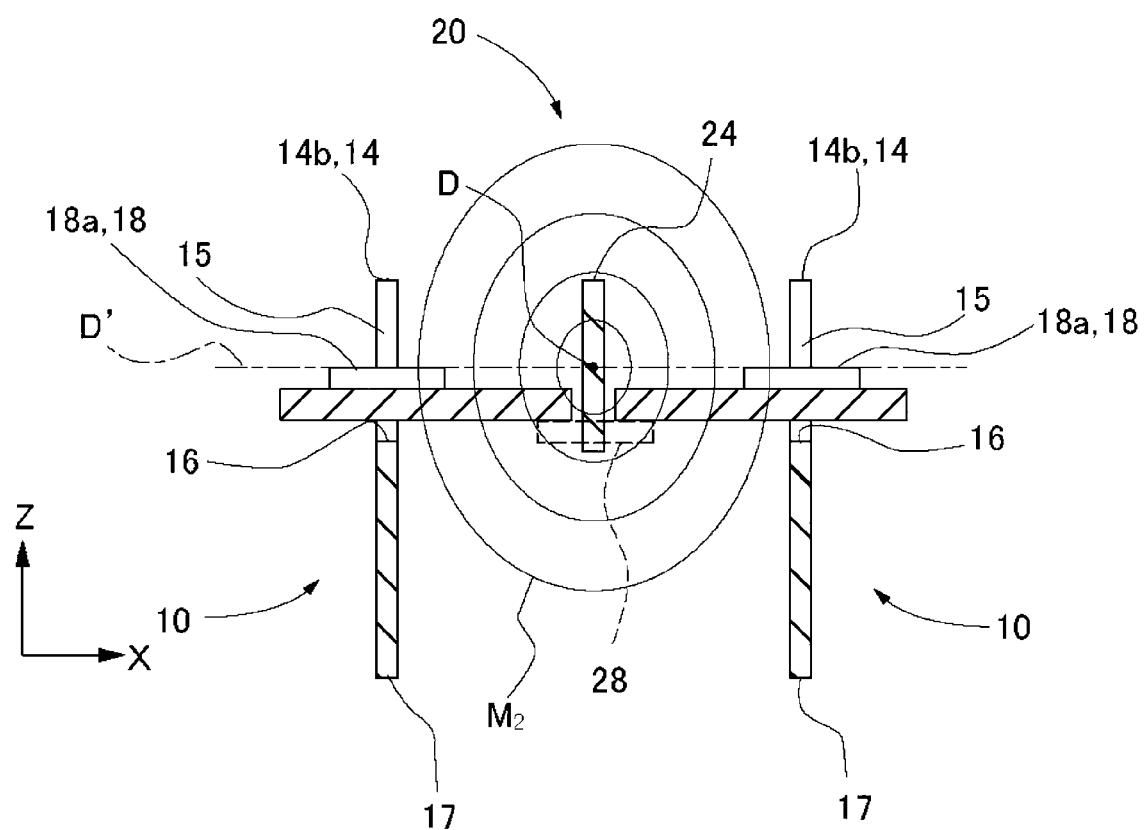
FIG. 5 is a cross-sectional view taken along line V-V in FIG. 1.

In the present embodiment, as illustrated in FIG. 5, the vertical positions of the first magneto-electric conversion elements 18 are aligned with the current center position D in the second extending portion 24. This reduces the influence of a magnetic field $M_2$ from the adjacent second bus bar 20 on the first magneto-electric conversion elements 18.

The current sensor 1 of the present embodiment is such that the first magneto-electric conversion elements 18 are mounted on the front surface of the substrate 2, and the second magneto-electric conversion element 28 is mounted on the back surface of the substrate 2, as described above, so that the second magneto-electric conversion element 28 is disposed lower than the first magneto-electric conversion elements 18. Since this eliminates the need for means for making the vertical position of the second magneto-electric conversion element 28 different from the vertical positions of the first magneto-electric conversion elements 18, such as changing the shape of the substrate or adding another member, the position of the second magneto-electric conversion element 28 can be adjusted using a simple configuration.

Since the shapes of the first bus bars 10 and the second bus bar 20 differ, as described above, the resistance of the bus bars may differ. Specifically, since the current path of the first bus bars 10 is longer than that of the second bus bar 20, the resistance tends to be relatively large. In such a case, the lower end of the proximal first extending portion 14a is disposed lower than the lower end of the distal first extending portion 14b so that the cross-sectional area of the joint portion between the proximal first extending portion 14a and the first stepped portion is increased, so that the resistance of the first bus bars 10 can be reduced.

If a substrate 2 with a different thickness is used, the vertical position of the first magneto-electric conversion elements 18 and the vertical relative position of the second magneto-electric conversion element 28 may relatively differ. In such a case, the shapes of the first bus bars 10 and the second bus bar 20 may be changed to make the magnetic positions of the first magneto-electric conversion elements 18 and the second magneto-electric conversion element 28 provided on and under the substrate 2 appropriate.

Figures 6A, 6B:
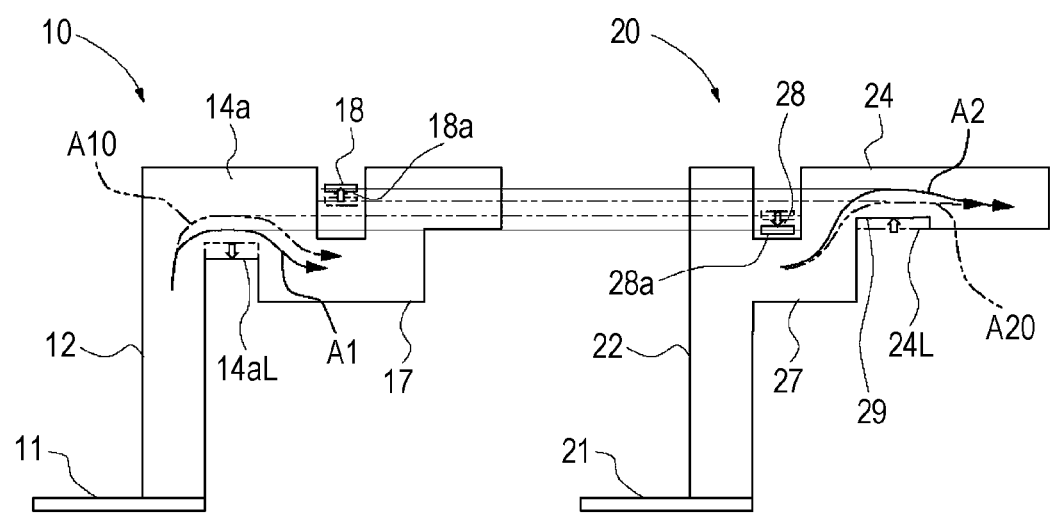
FIG. 6A is an explanatory diagram illustrating the state of a first bus bar according to a modification of the present embodiment viewed from the side.
FIG. 6B is an exemplary diagram illustrating the state of a second bus bar according to a modification of the present embodiment viewed from the side.

FIG. 6A is an explanatory diagram illustrating the state of a first bus bar according to a modification of the present embodiment viewed from the side. FIG. 6B is an explanatory diagram illustrating the state of a second bus bar according to a modification of the present embodiment viewed from the side. As illustrated in FIG. 6A, the central position of the current flowing through the first extending portion 14 can be changed in the vertical direction by adjusting the position of the lower end edge 14aL of the proximal first extending portion 14a. In FIG. 6A, a current path in the case where the position of the lower end edge 14aL of the proximal first extending portion 14a is a position indicated by the dashed line is denoted by reference sign A10, and a current path in the case where the position of the lower end edge 14aL of the proximal first extending portion 14a is a position indicated by the solid line is denoted by reference sign A1.

Thus, the current path can be moved downward by changing the position of the lower end edge 14aL of the proximal first extending portion 14a downward. As a result, even if the position of the second magneto-electric conversion element 28 is changed downward, the induction magnetic field due to the current flowing through the first bus bar 10 can be made substantially more orthogonal to the second mount surface 28a and the second sensitive axis 28b of the second magneto-electric conversion element 28.

Alternatively, as illustrated in FIG. 6B, a portion of the second extending portion 24 contiguous to the second stepped portion 27 may have an adjusting cutout portion 29 which is recessed upward from the lower end edge 24L of the second extending portion 24. By adjusting the depth of the cutout, the central position of the current flowing from the second stepped portion 27 to the second extending portion 24 can be changed in the vertical direction. In FIG. 6B, the current path in the case where the position of the lower end edge 24L of the second extending portion 24 is a position indicated by the two-dot chain line is denoted by reference sign A20, and the current path in the case where the adjusting cutout portion 29 is provided, so that the position of the lower end edge 24L of the second extending portion 24 shifts to a position indicated by the solid line is denoted by reference sign A2.

Thus, the current path can be moved upward by providing the adjusting cutout portion 29 to change the position of the lower end edge 24L of the second extending portion 24 upward. As a result, even if the position of the first magneto-electric conversion element 18 is changed upward, the induction magnetic field due to the current flowing through the second bus bar 20 can be made substantially more orthogonal to the first mount surface 18a and the first sensitive axis 18b of the first magneto-electric conversion element 18.

Although in the above embodiment the number of first bus bars 10 is two, and the number of second bus bars 20 is one, the number of second bus bars 20 may be two, and the number of first bus bars 10 may be one. The number of bus bars is not limited to three and may be any number.

Although the first bus bars 10 and the second bus bar 20 have the shapes illustrated in FIG. 1 to FIGS. 6A and 6B, this is given for illustrative purposes only. The first bus bars 10 and the second bus bar 20 may have different shapes. For example, although the corner of each bus bar is right-angled, the corner may be chamfered in a straight or arc shape.

Although, in the first bus bar 10, the first rising portion 12 is erected vertically from the first terminal portion 11, the first rising portion 12 may be formed at a different angle. Although the first rising portion 12 and the first extending portion 14 also form a right angle, they may form a different angle. This also applies to the second bus bar 20.

In the first bus bars 10, the current flowing through the first stepped portion 17 mainly flows through an upper part (adjacent to the first cutout portion 15). Therefore, the first stepped portion 17 may be shaped like a trapezoid in which the length of the lower end of the first stepped portion 17 in the extending direction is shorter than the length of the upper end in the extending direction, that is, the lower bottom is shorter. This can reduce the weight of the first bus bar 10.

Examples of the magneto-electric conversion element include, in addition to the magnetoresistive sensor, a Hall element and other kinds of element. In the case of the Hall element, in the present invention, the direction of the normal to the magnetosensitive surface is defined as the direction of the sensitive axis.

What is claimed is:
1. A current sensor comprising:
a plurality of bus bars disposed parallel to each other;
a magneto-electric conversion element configured to detect an induction magnetic field generated due to a current flowing through the plurality of bus bars; and
an insulating substrate on which the magneto-electric conversion element is mounted,
wherein the each of the plurality of bus bars include a rising portion rising upward from a reference surface that is a horizontal surface, an extending portion extending from the rising portion in a direction parallel to the reference surface, a cutout portion recessed downward from an upper end of the extending portion, and a stepped portion disposed so as to include a lower part of the cutout portion and protruding downward from a lower end of the extending portion,
wherein the plurality of bus bars include at least a first bus bar and a second bus bar located next to the first bus bar,
wherein the first bus bar includes a first rising portion that is the rising portion, a first extending portion that is the extending portion, a first cutout portion that is the cutout portion, and a first stepped portion that is the stepped portion,
wherein the second bus bar includes a second rising portion that is the rising portion, a second extending portion that is the extending portion, a second cutout portion that is the cutout portion, and a second stepped portion that is the stepped portion, and the second extending portion includes an adjustable cutout portion at a portion of the second extending portion contiguous to the second stepped portion, the cutout portion recessed upward from a lower end of the second extending portion,
wherein the magneto-electric conversion element includes a first magneto-electric conversion element disposed at the first bus bar and a second magneto-electric conversion element disposed at the second bus bar, each of the first magneto-electric conversion element and the second magneto-electric conversion element being disposed in the cutout portion in such a manner that a mount surface faces a bottom surface of the cutout portion and that a sensitive axis is orthogonal to a side of an adjacent bus bar,
wherein the first stepped portion is disposed away from the first rising portion in an extending direction of the first extending portion, and the second magneto-electric conversion element is disposed so as to face a side of the first extending portion located between the first rising portion and the first cutout portion,
wherein the second stepped portion is disposed contiguously from the second rising portion in an extending direction of the second extending portion, and the first magneto-electric conversion element is disposed so as to face a side of the second extending portion located contiguously to the second cutout portion in the extending direction, and
wherein the second magneto-electric conversion element is disposed lower, relative to the reference surface, than the first magneto-electric conversion element.

2. The current sensor according to claim 1, wherein the first magneto-electric conversion element is mounted on an upper surface of the insulating substrate, and the second magneto-electric conversion element is mounted on a lower surface of the insulating substrate.

3. The current sensor according to claim 1, wherein a first lower end edge of the first extending portion located between the first rising portion and the first stepped portion is located lower, relative to the reference surface, than a second lower end edge of the first extending portion located farther in the extending direction than the first stepped portion.

\* \* \* \* \*